United States Patent
Jung et al.

(10) Patent No.: US 10,038,155 B2
(45) Date of Patent: Jul. 31, 2018

(54) COMPOSITION FOR SURFACE-MODIFYING INSULATOR, METHOD FOR SURFACE-MODIFYING INSULATOR, INSULATOR, AND THIN FILM TRANSISTOR

(71) Applicant: Samsung Electronics Co., Ltd., Suwon-si, Gyeonggi-do (KR)

(72) Inventors: Ji Young Jung, Seoul (KR); Eun Kyung Lee, Seoul (KR); Ajeong Choi, Suwon-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 119 days.

(21) Appl. No.: 14/721,474

(22) Filed: May 26, 2015

(65) Prior Publication Data
US 2016/0079535 A1    Mar. 17, 2016

(30) Foreign Application Priority Data
Sep. 16, 2014    (KR) .................. 10-2014-0123031

(51) Int. Cl.
| H01L 51/40 | (2006.01) |
| C08F 2/46 | (2006.01) |
| H01L 51/05 | (2006.01) |
| H01L 51/00 | (2006.01) |

(52) U.S. Cl.
CPC ...... *H01L 51/0533* (2013.01); *H01L 51/0053* (2013.01)

(58) Field of Classification Search
USPC ............................. 526/247; 257/40
See application file for complete search history.

(56) References Cited

U.S. PATENT DOCUMENTS

| 7,781,763 B2 * | 8/2010 | Hahn .................. G03F 7/0046 252/500 |
| 7,820,730 B2 * | 10/2010 | Hahn .................. C08G 65/007 522/6 |
| 2004/0099952 A1 * | 5/2004 | Goodner .......... H01L 21/02118 257/758 |
| 2007/0105396 A1 * | 5/2007 | Li ...................... B82Y 10/00 438/758 |

FOREIGN PATENT DOCUMENTS

| KR | 10-2008-0029453 A | * | 4/2008 |
| KR | 10-2009-0017301 A | * | 2/2009 |
| KR | 20090017301 A | | 2/2009 |
| KR | 10-1249219 B1 | | 4/2013 |
| WO | WO-2010049728 A1 | | 5/2010 |

* cited by examiner

*Primary Examiner* — Mark Kaucher
*Assistant Examiner* — Henry Hu
(74) *Attorney, Agent, or Firm* — Harness, Dickey & Pierce, P.L.C.

(57) ABSTRACT

A composition includes a compound including a structural unit represented by the above Chemical Formula 1, and a structural unit represented by the above Chemical Formula 2 on at least one terminal end.

18 Claims, 6 Drawing Sheets

COMPOSITION FOR SURFACE-MODIFYING INSULATOR, METHOD FOR SURFACE-MODIFYING INSULATOR, INSULATOR, AND THIN FILM TRANSISTOR

CROSS REFERENCE TO RELATED APPLICATION

This application claims priority to and the benefit of Korean Patent Application No. 10-2014-0123031 filed in the Korean Intellectual Property Office on Sep. 16, 2014, the entire contents of which are incorporated herein by reference.

BACKGROUND

1. Field

Example embodiments relate to a composition for surface-modifying an insulator, a method for surface-modifying an insulator, an insulator, and a thin film transistor.

2. Description of the Related Art

A flat panel display (e.g., a liquid crystal display (LCD), an organic light emitting diode (OLED) display, and an electrophoretic display) includes a pair of electric field-generating electrodes and an electrical optical active layer interposed therebetween. The liquid crystal display (LCD) includes a liquid crystal layer as an electric optical active layer, and the organic light emitting diode (OLED) display includes an organic emission layer as an electrical optical active layer.

One of the pair of electric field-generating electrodes is commonly connected to a switching device and receives an electrical signal, and the electrical optical active layer transforms the electrical signal into an optical signal and thus displays an image.

The flat panel display includes a thin film transistor array panel including a three-terminal element of a thin film transistor (TFT) as a switching element, a gate line transferring a scan signal for controlling the thin film transistor, and a data line transferring a signal applied to a pixel electrode.

Characteristics of the thin film transistor are determined by various factors (e.g., mobility, a leakage current, and an on/off current ratio), but among these factors, performance of the gate insulator contacting a semiconductor is important.

SUMMARY

Example embodiments provide a composition for surface-modifying an insulator.

Example embodiments also provide a method for surface-modifying an insulator.

Example embodiments also provide an insulator coated with the composition for surface-modifying an insulator.

Example embodiments also provide a thin film transistor including the insulator.

According to example embodiments, a composition for surface-modifying an insulator includes a compound including a structural unit represented by the following Chemical Formula 1, and a structural unit represented by the following Chemical Formula 2 on at least one terminal end.

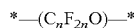  [Chemical Formula 1]

In Chemical Formula 1, n is an integer of 1 or more.

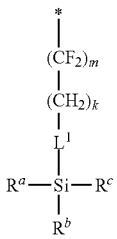  [Chemical Formula 2]

In Chemical Formula 2,
each of $R^a$ to $R^c$ are independently one of a $C_1$ to $C_{10}$ alkyl group, provided that at least one of $R^a$ to $R^c$ is one of a $C_1$ to $C_{30}$ alkoxy group, a halogen, a hydroxy group, and a carboxyl group, $L^1$ is one of a single bond, —O—, a substituted or unsubstituted $C_1$ to $C_{30}$ alkylene group, a substituted or unsubstituted $C_3$ to $C_{30}$ cycloalkylene group, a substituted or unsubstituted $C_2$ to $C_{30}$ alkenylene group, a substituted or unsubstituted $C_6$ to $C_{30}$ arylene group, and a combination thereof, and each of m and k are independently integers of 0 or more.

In Chemical Formula 1, n may be an integer of 1 to 10.

In Chemical Formula 2, m and k are independently integers of 0 to 20.

The composition may include one of a compound represented by the following Chemical Formula 3, a compound represented by the following Chemical Formula 4, and a combination thereof.

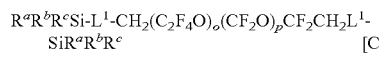  [Chemical Formula 3]

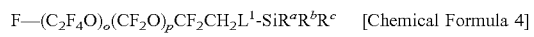  [Chemical Formula 4]

In Chemical Formulae 3 and 4,
$R^a$ to $R^c$ and $L^1$ are the same as defined in Chemical Formula 2, and o and p are independently integers of 1 or more.

The o and p may independently be integers of 1 to 100.
The o and p may independently be integers of 1 to 50.
The composition may include the compound represented by Chemical Formula 4.
The composition may include the compound represented by Chemical Formula 3.
The composition may include both the compound represented by Chemical Formula 3 and the compound represented by Chemical Formula 4.
The compound represented by Chemical Formula 3 and the compound represented by Chemical Formula 4 may be included in a weight ratio of about 1:99 to about 99:1.
The compound may have a weight average molecular weight of about 500 g/mol to about 50,000 g/mol.

According to example embodiments, a method for surface-modifying an insulator includes coating an insulator with the composition according to example embodiments.

The composition may be spin-coated on the insulator.
The method for surface-modifying an insulator may further include treating the insulator before coating the insulator with the composition, and the treatment may include one of an oxygen plasma treatment and UV ozone treatment.
The method for surface-modifying an insulator may further include heat-treating the insulator after coating the composition.

According to example embodiments, an insulator includes the composition of example embodiments coated on a surface thereof.

According to example embodiments, a thin film transistor includes the insulator of example embodiments.

The thin film transistor may include a gate electrode, a semiconductor overlapping the gate electrode, and a source electrode and a drain electrode electrically connected to the semiconductor. The insulator may be between the gate electrode and the semiconductor.

The semiconductor may be an organic semiconductor.

The compound represented by Chemical Formula 3 and the compound represented by Chemical Formula 4 may be included in a weight ratio of about 30:70 to about 70:30.

The compound represented by Chemical Formula 3 and the compound represented by Chemical Formula 4 may be included in a weight ratio of about 50:50.

The compound may have a weight average molecular weight of 4000 g/mol.

DETAILED DESCRIPTION

Figure 1:
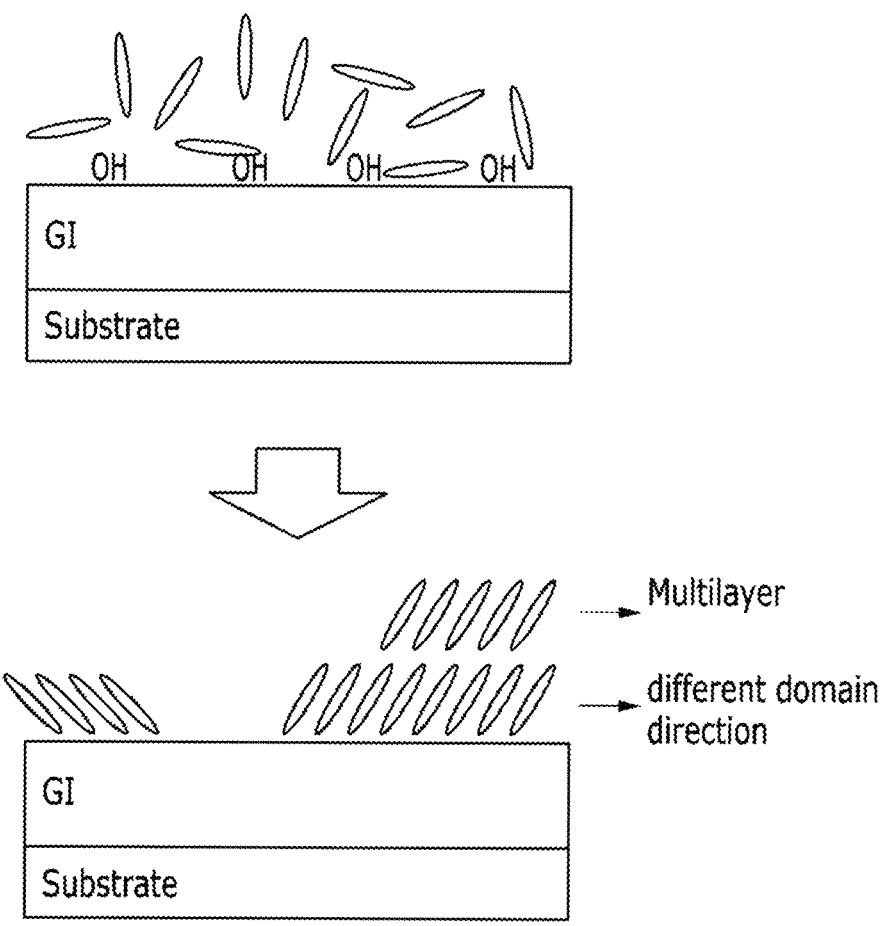
FIG. 1 is a schematic view showing formation of a self-assembled monolayer on a gate insulator when the surface of the gate insulator is modified with a composition for surface-modifying an insulator according to a conventional art.

The present disclosure will be described more fully hereinafter with reference to the accompanying drawings, in which example embodiments of this disclosure are shown. However, this disclosure may be embodied in many different forms and is not to be construed as limited to the example embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concepts.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concepts. As used herein, the singular forms "a," "an" and "the" are intended to include the plural forms as well, unless the context clearly indicates otherwise. It will be further understood that the terms "comprises", "includes", "including" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concepts.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Unless otherwise defined, all terms (including technical and scientific terms) used herein have the same meaning as commonly understood by one of ordinary skill in the art to which the inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, a composition for surface-modifying an insulator according to example embodiments is described.

The composition for surface-modifying an insulator according to example embodiments includes a perfluoropolyether compound having a silane functional group on at least one terminal end.

The perfluoropolyether compound, that is, the compound for surface-modifying an insulator according to example embodiments, includes a structural unit represented by the following Chemical Formula 1, and a structural unit represented by the following Chemical Formula 2 on at least one terminal end.

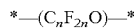   [Chemical Formula 1]

In Chemical Formula 1, n is an integer of 1 or more.

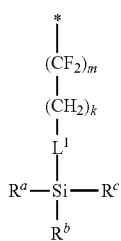   [Chemical Formula 2]

In Chemical Formula 2, each of $R^a$ to $R^c$ are independently one of a $C_1$ to $C_{10}$ alkyl group, provided that at least one of $R^a$ to $R^c$ is one of a $C_1$ to $C_{30}$ alkoxy group, a halogen, a hydroxy group, and a carboxyl group, $L^1$ is one of a single bond, —O—, a substituted or unsubstituted $C_1$ to $C_{30}$ alkylene group, a substituted or unsubstituted $C_3$ to $C_{30}$ cycloalkylene group, a substituted or unsubstituted $C_2$ to $C_{30}$ alkenylene group, a substituted or unsubstituted $C_6$ to $C_{30}$ arylene group, and a combination thereof, m is an integer of 0 or more, and k is an integer of 0 or more.

In Chemical Formula 1, n may be an integer of 1 to 10.

In Chemical Formula 2, m and k may independently be integers of 0 to 20.

In general, the surface of an insulator has an influence on the microstructure of a semiconductor thereon, and thus determines performance of a device. Accordingly, as the insulator has a flatter surface and has lower surface energy, a device has better performance, and herein, the surface energy may be lowered by coating a thin layer on the surface of the insulator.

FIG. 1 is a schematic view showing formation of a self-assembled monolayer on a gate insulator when the gate insulator is surface-modified by a composition for surface-modifying a gate insulator according to a conventional art. Conventionally, a pretreated substrate or insulator is dipped for a predetermined or given time in a solution obtained by dissolving molecules for forming a low molecular self-assembled monolayer (e.g., octadecyltrichlorosilane, octyltrichlorosilane, 3-trichlorosilylpropane-1-thiol, trichloro(2-phenylethyl)silane, (3-mercaptopropyl)trimethoxysilane, bis(trimethylsilyl)amine, and 3,3,3-trifluoropropyltrichlorosilane) in a solvent (e.g., hexane), taken out therefrom, and then heat-treated after washing away non-reaction materials therefrom, forming a self-assembled monolayer to surface-treat the insulator. However, as shown in FIG. 1, the molecules for forming the self-assembled monolayer may more easily form a multilayer rather than a single layer. In addition, the self-assembled monolayer has crystallinity, but the crystals have no predetermined or given direction instead being formed in multiple domains. Thus, uniformity of the self-assembled monolayer is deteriorated and fails to obtain a desired effect. In other words, because the conventional method of surface-modifying an insulator using the molecules for forming a self-assembled monolayer includes dissolving the molecules and dipping a substrate in the solution, the uniform surface modification of the insulator is difficult to control. Furthermore, because the substrate or the insulator as a whole should be dipped in the solution, the conventional surface modification is disadvantageous for a relatively large area process, and also has a problem of modifying both surfaces of the substrate or the insulator.

According to example embodiments, a composition for surface-modifying an insulator may more easily form a layer by a method of spin coating a pre-treated substrate or insulator using a polymer-type polymer material rather than a low molecular self-assembled monolayer. In other words, the surface of the insulator may be more easily modified by coating the composition for surface-modifying an insulator on the surface of the insulator without the dipping process of the conventional art. In other words, a uniform single layer may be formed in a short time in a well-known coating method (e.g., spin coating). In addition, because the substrate or the insulator as a whole does not need to be dipped in a solution, example embodiments may be more easily applied to a relatively large area process.

In addition, a fluorine element largely contributes to decreasing surface energy on the surface of the insulator but has a problem of not being properly coated. Accordingly, polymethyl methacrylate (PMMA) has a smaller effect of decreasing surface energy than the element but are in general coated on the surface of the insulator due to relatively easy coating. However, the compound for surface-modifying an insulator according to example embodiments includes a plurality of fluorine elements and thus may decrease surface energy on the surface of the insulator and simultaneously is more easily spin-coated on the surface of the insulator, and thus may more easily modify the surface of the insulator through simple coating.

The composition for surface-modifying an insulator may include a compound represented by the following Chemical Formula 3, a compound represented by the following Chemical Formula 4, or a combination thereof.

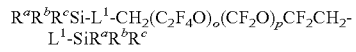   [Chemical Formula 3]

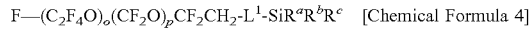   [Chemical Formula 4]

In Chemical Formulae 3 and 4, $R^a$ to $R^c$ and $L^1$ are the same as defined in Chemical Formula 2, and the o and p are independently integers of 1 or more.

The o may be an integer of 1 to 100, for example, an integer of 1 to 50.

The p may be an integer of 1 to 100, for example, an integer of 1 to 50.

The compound of the composition for surface-modifying an insulator may have a weight average molecular weight of about 500 g/mol to about 50,000 g/mol. When the compound has a weight average molecular weight within the range, the composition may have appropriate viscosity for coating on the surface of the insulator.

The composition for surface-modifying an insulator may include both the compound represented by Chemical Formula 3 and the compound represented by Chemical Formula 4, wherein the compound represented by Chemical Formula 3 and the compound represented by Chemical Formula 4 may be included in a weight ratio of about 1:99 to about 99:1, for example, about 30:70 to about 70:30.

The composition for surface-modifying an insulator may further include a solvent. When the solvent is further included, a process of spin coating may be more easily performed by adjusting the viscosity of the composition for surface-modifying an insulator.

The solvent is not particularly limited, and may be, for example, an aliphatic hydrocarbon solvent (e.g., hexane); an aromatic hydrocarbon solvent (e.g., anisole, mesitylene, and/or xylene); a ketone-based solvent (e.g., methyl isobutyl ketone, 1-methyl-2-pyrrolidinone, and/or acetone); an ether based solvent (e.g., cyclohexanone, tetrahydrofuran, and/or isopropyl ether); an acetate-based solvent (e.g., ethyl acetate, butyl acetate, and/or propylene glycol methyl ether acetate); an alcohol based solvent (e.g., isopropyl alcohol and/or butanol); an amide based solvent (e.g., dimethyl acetamide and/or dimethyl formamide); a silicon-based solvent; or a combination thereof.

A method for surface-modifying an insulator according to example embodiments includes preparing an insulator and coating the insulator with the composition for surface-modifying an insulator according to example embodiments.

When the composition for surface-modifying an insulator is coated on the insulator, the coating method may be selected from well-known coating methods (e.g., spin coating, dip coating, casting, micro gravure coating, gravure coating, bar coating, roll coating, wire bar coating, spray coating, screen printing, flexo printing, offset printing, and inkjet printing), but example embodiments are not limited thereto. For example, the coating may be spin coating.

The spin coating may be performed, for example, at about 1000 rpm to about 3000 rpm for about 20 seconds to about 60 seconds.

The surface modification of an insulator may further include oxygen plasma treatment or UV-ozone treatment of the insulator before coating the composition for surface-modifying an insulator on the insulator.

The oxygen plasma treatment or UV-ozone treatment forms a hydroxy group on the surface of the insulator, so that the insulator may react with a silane group.

The oxygen plasma treatment may be performed, for example, with about 50 W to about 150 W for about 30 seconds to about 90 seconds.

Through the oxygen plasma treatment or UV-ozone treatment, the composition for surface-treating an insulator according to example embodiments is coated on the surface of the insulator having the hydroxy group on the surface.

In addition, the method for surface-modifying an insulator may further include a heat treatment and/or a sonic treatment of the insulator coated with the composition for surface-modifying an insulator. Through the heat treatment and/or the sonic treatment, non-reaction materials on the surface of the insulator may be removed.

The heat treatment may be performed, for example, at about 100° C. to about 200° C. for about 10 minutes to about 60 minutes.

The sonic treatment may be performed, for example, for about one minute to about 10 minutes.

The method for surface-modifying an insulator may form a hydrophobic layer having relatively low surface energy on the surface of the insulator in a relatively short time of less than about one minute. In addition, because the dipping in a solution is not used to modify the surface of the insulator, one surface rather than both surfaces of the insulator may be modified, and thus may be used with automated equipment.

Example embodiments provide an insulator manufactured in the method for surface-modifying an insulator.

The insulator may be an organic/inorganic composite insulator surface-modified by the composition for surface-modifying an insulator according to example embodiments, and may include a hydrophobic layer having relatively low surface energy.

The insulator may be used in an area requiring insulation characteristics of an electronic device without a particular limit, for example, for a gate insulator, a dielectric material, and a filler.

When the insulator is used as an insulator for a thin film transistor, the insulator may remarkably deteriorate a leakage current due to improved quality and relatively high dielectric strength, and improve characteristics of the thin film transistor.

As illustrated in the following examples in detail, a thin film transistor including an insulator surface-modified by using the composition for surface-modifying an insulator according to example embodiments shows improved charge mobility inside a transistor (refer to FIG. 3), and improved arrangement of organic semiconductors on the insulator (refer to FIG. 5).

Figure 4:
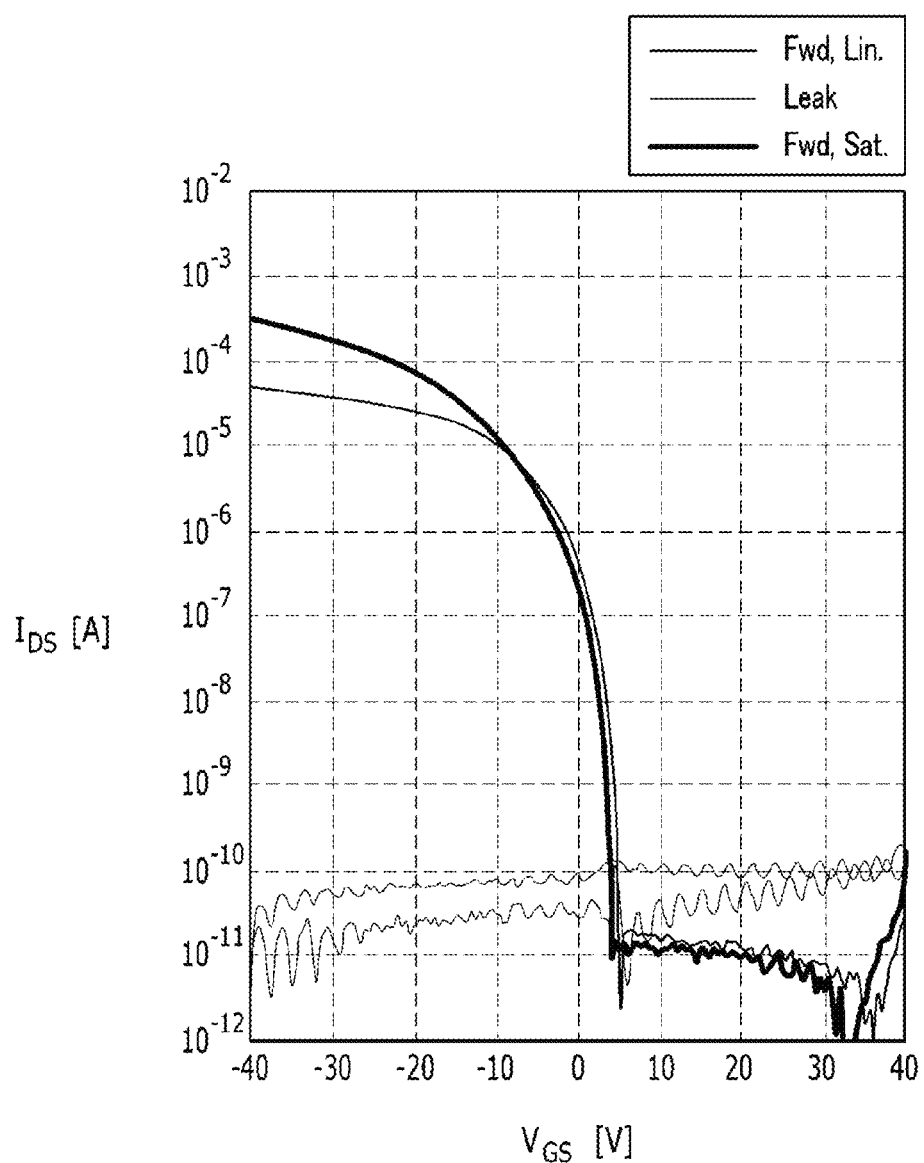
FIG. 4 is a graph showing charge mobility inside a thin film transistor including a gate insulator according to Comparative Preparation Example 1, In FIG. 5, an upper view is an atomic force microscope photograph showing an organic semiconductor on the gate insulator according to Preparation Example 1, while a lower view is an enlarged view of the atomic force microscope photograph, and FIG. 6 an upper view is an atomic force microscope photograph showing an organic semiconductor on the gate insulator according to Comparative Preparation Example 1, while a lower view is an enlarged view of the atomic force microscope photograph.
Figure 6:
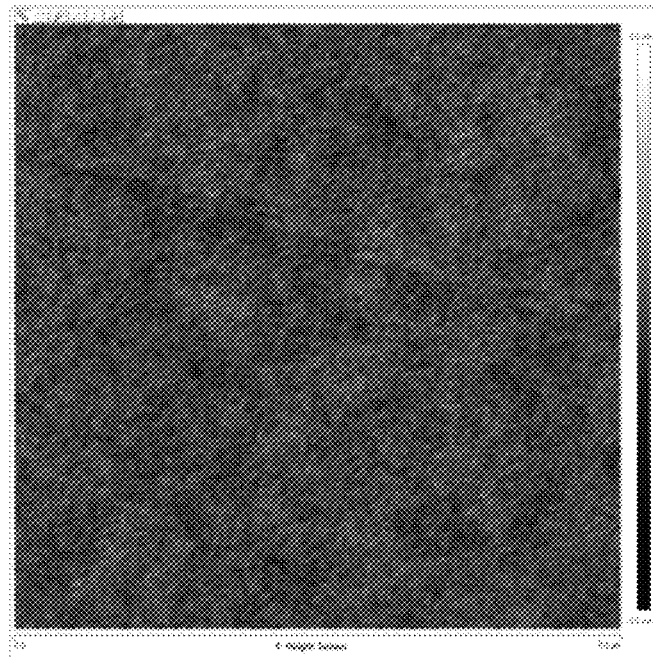
Figure 6:
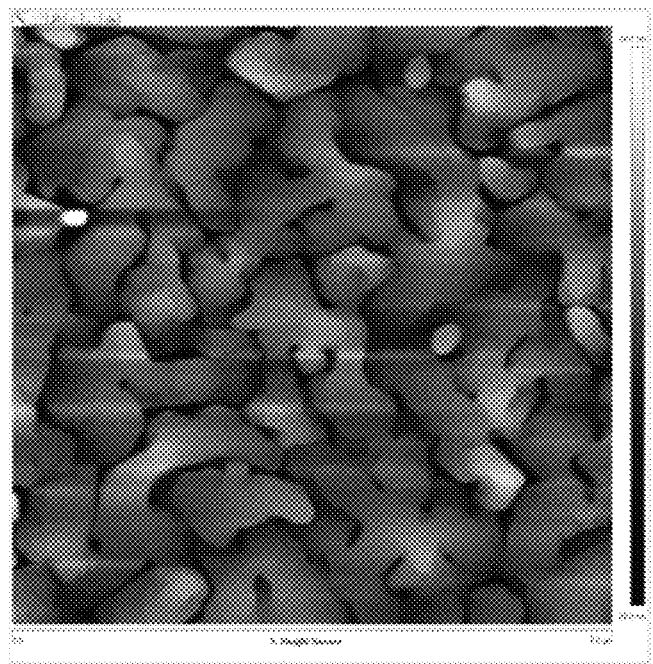

On the other hand, a thin film transistor including a gate insulator surface-modified by a material for forming a conventional low molecular self-assembled monolayer according to a Comparative Preparation Example 1 shows lower charge mobility and less uniform arrangement of organic semiconductors than those of a thin film transistor including a gate insulating layer according to Preparation Example 1 (refer to FIGS. 4 and 6).

Accordingly, example embodiments also provide a thin film transistor including the insulator according to example embodiments.

Hereinafter, the thin film transistor including the insulator as one example is illustrated.

Figure 2:
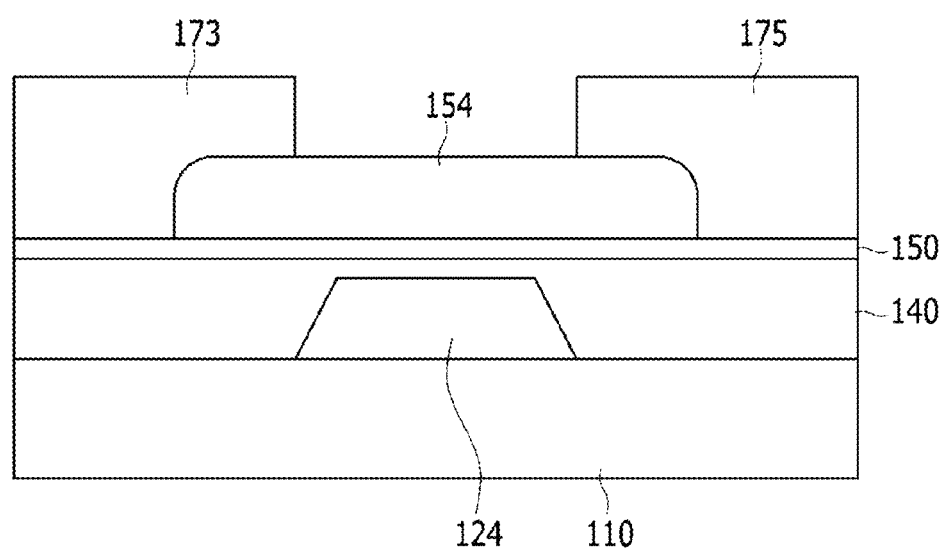
FIG. 2 is a cross-sectional view showing a thin film transistor according to example embodiments.

FIG. 2 is a cross-sectional view showing a thin film transistor according to example embodiments.

Referring to FIG. 2, the thin film transistor according to example embodiments includes a gate electrode 124 formed on a substrate 110, a semiconductor 154 overlapping the gate electrode 124, a gate insulator 140 positioned between the gate electrode 124 and the semiconductor 154, a surface-modified layer 150 formed on the gate insulator 140, and a source electrode 173 and a drain electrode 175 electrically connected to the semiconductor 154.

The substrate 110 may be made of, for example, transparent glass, silicon, or a polymer. The gate electrode 124 is connected to a gate line (not shown) transmitting a data signal, and may be made of, for example, gold (Au), copper (Cu), nickel (Ni), aluminum (Al), molybdenum (Mo), chromium (Cr), tantalum (Ta), titanium (Ti), an alloy thereof, and a combination thereof, but is not limited thereto.

The semiconductor 154 may be an organic semiconductor or an inorganic semiconductor, for example, an organic semiconductor. The organic semiconductor may be, for example, at least one selected from pentacene and a precursor thereof, tetrabenzoporphyrin and a precursor thereof, polyphenylenevinylene and a precursor thereof, polyfluorene and a precursor thereof, polythienylenevinylene and a precursor thereof, polythiophene and a precursor thereof, polythienothiophene and a precursor thereof, polyarylamine and a precursor thereof, phthalocyanine and a precursor thereof, metallized phthalocyanine or a halogenated derivative thereof, perylenetetracarboxylic dianhydride (PTCDA), naphthalenetetracarboxylic dianhydride (NTCDA) or an imide derivative thereof, perylene, or coronene, and a substituent-containing derivatives thereof, but is not limited thereto.

The gate insulator 140 may be formed of a material selected from polyvinyl phenol, poly(methylmethacrylate), polyacrylate, polyvinyl alcohol, $SiN_i$ (0<i<4), $SiO_2$, $Al_2O_3$, and a derivative thereof, but is not limited thereto. In addition, the material is coated and then photo-cured and/or thermally-cured and thus forms an insulator thin film.

The source electrode 173 and the drain electrode 175 face each other with the semiconductor 154 therebetween, and are electrically connected to the semiconductor 154. The source electrode 173 is connected to a data line (not shown) transferring a data signal. The source electrode 173 and drain electrode 175 may be made of, for example, gold (Au), copper (Cu), nickel (Ni), aluminum (Al), molybdenum (Mo), chromium (Cr), tantalum (Ta), titanium (Ti), an alloy thereof, and a combination thereof, but is not limited thereto.

The thin film transistor may be applied to various electronic devices (e.g., a semiconductor device, a flat panel display, an energy device, and a sensor). The electronic device may include, for example, a liquid crystal display (LCD), an organic light emitting device, a solar cell, and an organic sensor.

Hereinafter, the present disclosure is illustrated in more detail with reference to examples. However, these are examples, and the present disclosure is not limited thereto.

Preparation of Insulator

Preparation Example 1

The surface of a gate insulator substrate is oxygen plasma-treated (100 W, 60 seconds) to produce a hydroxy group thereon, which will react with a silane functional group. On the surface of the gate insulator substrate, a composition for surface-modifying an insulator including a compound represented by the following Chemical Formula 3-1 is spin-coated at 2000 rpm for 40 seconds. Then, the coated substrate is heat-treated at 150° C. for 30 minutes, so that the silane functional group may react with the hydroxy group on the surface of the insulator substrate, and then sonic-treated for 3 minutes to remove a non-reactant, manufacturing a surface-modified gate insulator.

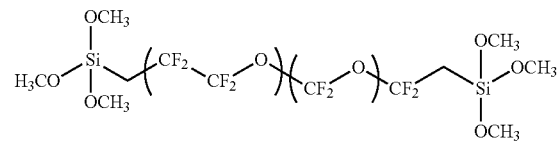

[Chemical Formula 3-1]

The compound represented by the above Chemical Formula 3-1 has a weight average molecular weight of about 4000 g/mol when measured in a gel permeation chromatography (GPC) method.

Preparation Example 2

A surface-modified gate insulator is prepared according to the same method as Preparation Example 1, except for using a compound represented by the following Chemical Formula 4-1 instead of the compound represented by the above Chemical Formula 3-1.

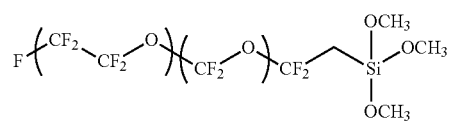

[Chemical Formula 4-1]

The compound represented by the above Chemical Formula 4-1 has a weight average molecular weight of about 4000 g/mol when measured in a GPC method.

Preparation Example 3

A surface-modified gate insulator is prepared according the same method as Preparation Example, 1 except for using a mixture of the compounds represented by the Chemical Formulae 3-1 and 4-1 in a weight ratio of 50:50 instead of just the compound represented by the above Chemical Formula 3-1.

Comparative Preparation Example 1

The surface of a gate insulator substrate is oxygen plasma-treated (100 W, 60 seconds) to form a hydroxy group thereon. The gate insulator substrate having the hydroxy group on the surface is dipped in 1000 ml of a solution obtained by dissolving 1.2 mL of octadecyltrichlorosilane in a hexane solvent and then maintained therein for one hour. Then, the substrate is taken out and non-reaction materials washed off, and then heat-treated at 150° C. for 30 minutes, manufacturing a surface-modified gate insulator.

Evaluation

Characteristics of each thin film transistor respectively including the gate insulators according to Preparation Examples 1 to 3 and Comparative Preparation Example 1 are evaluated. The characteristics of the thin film transistor are evaluated by using charge mobility, surface roughness, and atomic force microscope photographs of an organic semiconductor.

Figure 3:
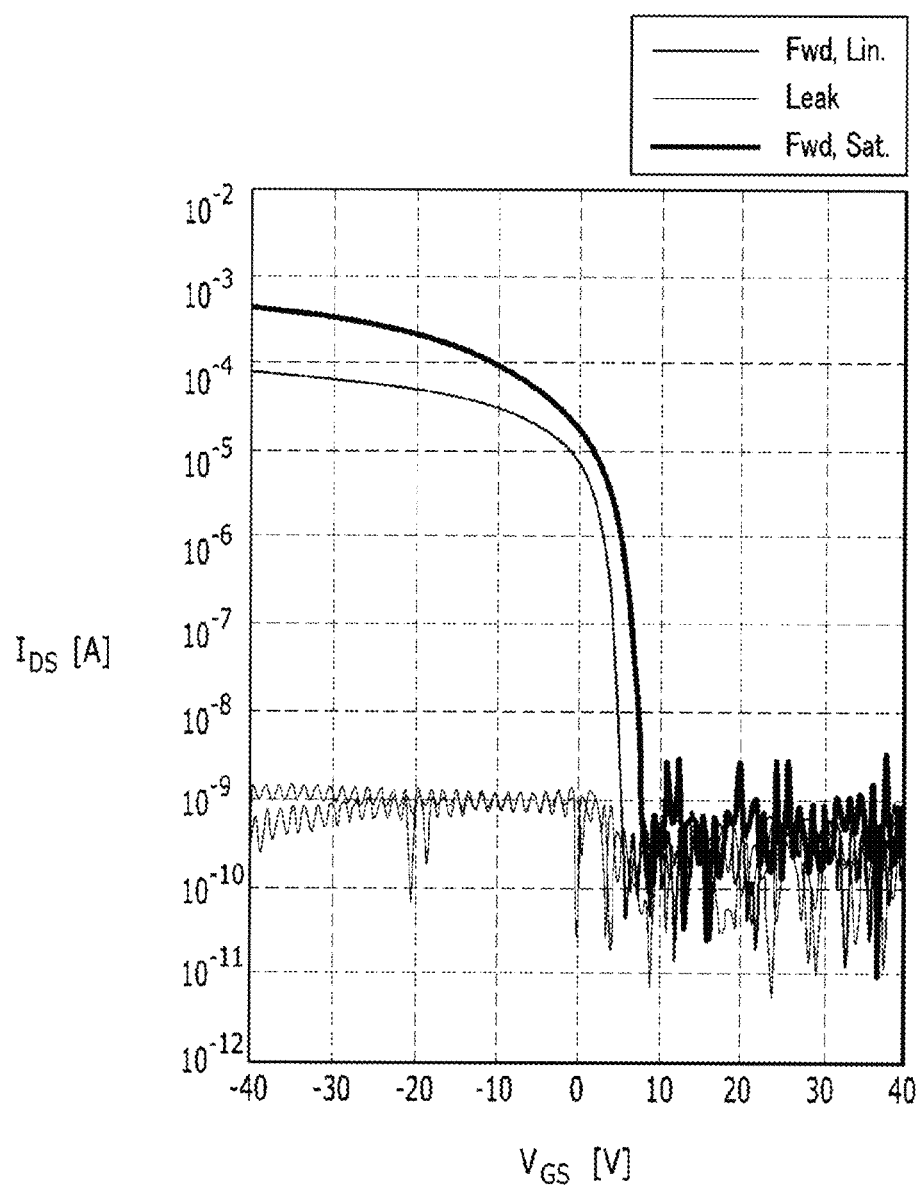
FIG. 3 is a graph showing charge mobility inside a thin film transistor including a gate insulator according to Preparation Example 1.
Figure 5:
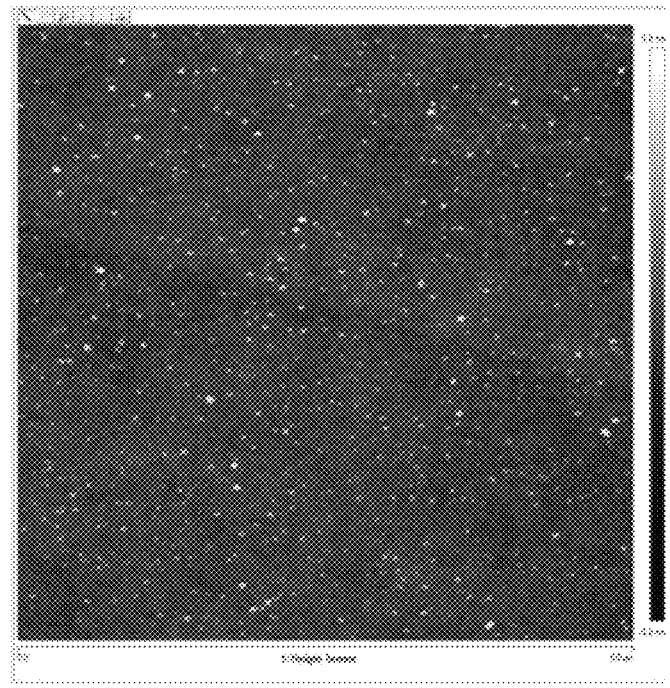
Figure 5:
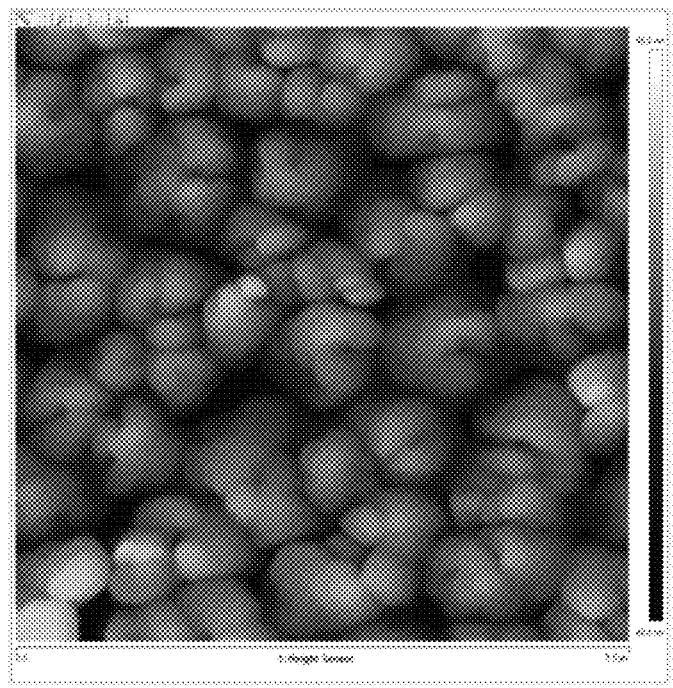

FIG. 3 is a graph showing charge mobility inside a thin film transistor including the gate insulator according to Preparation Example 1, FIG. 4 is a graph showing charge mobility inside a thin film transistor including the gate insulator according to Comparative Preparation Example 1, An upper view of FIG. 5 is an atomic force microscope photograph showing a semiconductor on the gate insulator according to Preparation Example 1, and the lower photograph is an enlarged view of the upper photograph, An upper view of FIG. 6 is an atomic force microscope photograph showing an organic semiconductor on the gate insulator according to Comparative Preparation Example 1, and the lower photograph is an enlarged view of the upper photograph.

The following Table 1 and FIGS. 3 and 4 show charge mobility of the thin film transistors respectively including the gate insulators according to Preparation Example 1 and Comparative Preparation Example 1.

TABLE 1

|  | Charge mobility (cm$^2$/V · s) |
| --- | --- |
| Preparation Example 1 | 10.05 |
| Comparative Preparation Example 1 | 5.1 |

The following Table 2 and FIGS. 5 and 6 show surface roughness of the gate insulators according to Preparation Examples 1 to 3 and Comparative Preparation Example 1.

TABLE 2

|  | Surface roughness (nm) |
| --- | --- |
| Preparation Example 1 | 0.220 |
| Preparation Example 2 | 0.340 |
| Preparation Example 3 | 0.410 |
| Comparative Preparation Example 1 | 0.540 |

Referring to Table 1 and FIGS. 3 and 4, a thin film transistor including the gate insulator according to Preparation Example 1 shows relatively high charge mobility and thus relatively high electrical reliability compared with a thin film transistor including the gate insulator according to Comparative Preparation Example 1.

Referring to Table 2 and FIGS. 5 and 6, the gate insulators according to Preparation Examples 1 to 3 have relatively small surface roughness and thus show an even surface and small surface energy compared with the gate insulator according to Comparative Preparation Example 1. In addition, the organic semiconductor on the gate insulator according to Preparation Example 1 shows improved charge mobility compared with the organic semiconductor on the gate insulator according to Comparative Preparation Example 1, and thus shows relatively high electrical reliability.

While this disclosure has been described in connection with what is presently considered to be practical example embodiments, it is to be understood that example embodiments are not limited to the disclosed embodiments, but, on the contrary, is intended to cover various modifications and equivalent arrangements included within the spirit and scope of the appended claims.

The invention claimed is:

1. A composition for surface-modifying a gate insulator, comprising:
a compound including at least one of a compound represented by the following Chemical Formula 4, and a combination of a compound represented by the following Chemical Formula 3 and a compound represented by the following Chemical Formula 4:

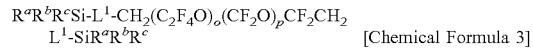
[Chemical Formula 3]

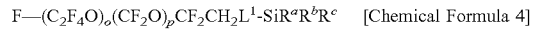
[Chemical Formula 4]

wherein, in Chemical Formulae 3 and 4,
each of $R^a$ to $R^c$ are independently one of a $C_1$ to $C_{10}$ alkyl group, provided that at least one of $R^a$ to $R^c$ is a $C_1$ to $C_{30}$ alkoxy group, a halogen, a hydroxy group, and a carboxyl group,
$L^1$ is one of a single bond, —O—, a substituted or unsubstituted $C_1$ to $C_{30}$ alkylene group, a substituted or unsubstituted $C_3$ to $C_{30}$ cycloalkylene group, a substituted or unsubstituted $C_2$ to $C_{30}$ alkenylene group, a substituted or unsubstituted $C_6$ to $C_{30}$ arylene group, and a combination thereof, and
the o and p are independently integers of 1 or more.

2. The composition of claim 1, wherein the o and p are independently integers of 1 to 100.

3. The composition of claim 1, wherein the o and p are independently integers of 1 to 50.

4. The composition of claim 1, wherein the composition includes the compound represented by Chemical Formula 4.

5. The composition of claim 1, wherein the composition includes both the compound represented by Chemical Formula 3 and the compound represented by Chemical Formula 4.

6. The composition of claim 5, wherein the compound represented by Chemical Formula 3 and the compound represented by Chemical Formula 4 are included in a weight ratio of about 1:99 to about 99:1.

7. The composition of claim 6, wherein the compound represented by Chemical Formula 3 and the compound represented by Chemical Formula 4 are included in a weight ratio of about 30:70 to about 70:30.

8. The composition of claim 7, wherein the compound represented by Chemical Formula 3 and the compound represented by Chemical Formula 4 are included in a weight ratio of about 50:50.

9. The composition of claim 1, wherein the compound has a weight average molecular weight of about 500 g/mol to about 50,000 g/mol.

10. The composition of claim 9, wherein the compound has a weight average molecular weight of 4000 g/mol.

11. A method for surface-modifying an insulator, the method comprising:
coating an insulator with the composition of claim 1.

12. The method of claim 11, wherein the coating includes spin-coating the composition on the insulator.

13. The method of claim 11, further comprising:
treating the insulator before the coating,
wherein the treating includes one of an oxygen plasma treatment and UV ozone treatment.

14. The method of claim 11, further comprising:
heat-treating the insulator after the coating.

15. An insulator comprising the composition of claim 1 coated on a surface thereof.

16. A thin film transistor comprising the insulator of claim 15.

17. The thin film transistor of claim 16, further comprising:
- a gate electrode;
- a semiconductor overlapping the gate electrode; and
- a source electrode and a drain electrode electrically connected to the semiconductor,
- wherein the insulator is between the gate electrode and the semiconductor.

18. The thin film transistor of claim 17, wherein the semiconductor is an organic semiconductor.

* * * * *